(12) United States Patent
Yang

(10) Patent No.: US 11,121,103 B1
(45) Date of Patent: Sep. 14, 2021

(54) SEMICONDUCTOR PACKAGE INCLUDING INTERCONNECTION MEMBER AND BONDING WIRES AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/808,397

(22) Filed: Mar. 4, 2020

(51) Int. Cl.
| | |
|---|---|
| H01L 21/76 | (2006.01) |
| H01L 23/538 | (2006.01) |
| H01L 23/00 | (2006.01) |
| H01L 21/768 | (2006.01) |
| H01L 21/56 | (2006.01) |
| H01L 23/31 | (2006.01) |

(52) U.S. Cl.
CPC .............. *H01L 24/05* (2013.01); *H01L 21/56* (2013.01); *H01L 21/768* (2013.01); *H01L 23/3128* (2013.01); *H01L 23/538* (2013.01); *H01L 24/13* (2013.01); *H01L 24/45* (2013.01); *H01L 24/73* (2013.01); *H01L 24/81* (2013.01); *H01L 24/85* (2013.01)

(58) Field of Classification Search
CPC ..... H01L 24/05; H01L 21/56; H01L 23/3128; H01L 23/538; H01L 24/13; H01L 24/45; H01L 24/73; H01L 24/81; H01L 24/85; H01L 25/0652; H01L 23/49816; H01L 25/50; H01L 25/0657; H01L 23/3121; H01L 24/46

USPC .......................................... 257/784; 438/617
See application file for complete search history.

(56) References Cited

U.S. PATENT DOCUMENTS

| | | | |
|---|---|---|---|
| 6,380,615 | B1 | 4/2002 | Park et al. |
| 8,637,983 | B2 | 1/2014 | Martinez et al. |
| 2002/0149097 | A1* | 10/2002 | Lee ...................... H01L 25/0652 257/686 |
| 2008/0265397 | A1* | 10/2008 | Lin ........................ H01L 24/73 257/691 |
| 2011/0156269 | A1* | 6/2011 | Nam ...................... H01L 24/49 257/774 |

(Continued)

FOREIGN PATENT DOCUMENTS

TW          201923978 A          6/2019

OTHER PUBLICATIONS

Wu-Der Yang, "Semiconductor Package and Manufacturing Method Thereof", U.S. Appl. No. 16/594,059, filed Oct. 6, 2019.

*Primary Examiner* — Didarul A Mazumder
(74) *Attorney, Agent, or Firm* — CKC & Partners Co., LLC

(57) ABSTRACT

A semiconductor package is provided which includes a package substrate, a first die, a second die, an interconnection member and a plurality of bonding wires. The first die is disposed on the package substrate. The second die is disposed over the first die. The interconnection member includes a connection plate, a plurality of redistribution structures and a plurality of bumps. The connection plate is connected to the first die. The redistribution structures are connected to the second die. The bumps couple the connection plate to the redistribution structures. The bonding wires couple the interconnection member to the package substrate and the first die.

20 Claims, 9 Drawing Sheets

(56) References Cited

U.S. PATENT DOCUMENTS

2015/0371968 A1* 12/2015 Haba ................. H01L 23/49816
  257/777

* cited by examiner

SEMICONDUCTOR PACKAGE INCLUDING INTERCONNECTION MEMBER AND BONDING WIRES AND MANUFACTURING METHOD THEREOF

BACKGROUND

Field of Invention

The present disclosure relates to semiconductor package and manufacturing method thereof.

Description of Related Art

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor devices.

SUMMARY

In accordance with an aspect of the present disclosure, a semiconductor package is provided. The semiconductor package includes a package substrate, a first die, a second die, an interconnection member and a plurality of bonding wires. The first die is disposed on the package substrate. The second die is disposed over the first die. The interconnection member is configured for coupling the first die and the second die and includes a connection plate, a plurality of redistribution structures and a plurality of bumps. The connection plate is connected to the first die. The redistribution structures are connected to the second die. The bumps couple the connection plate to the redistribution structures. The bonding wires couple the interconnection member to the package substrate and the first die.

According to some embodiments of the present invention, the first die includes a first bonding pad and a second bonding pad adjacent to the first bonding pad, and the connection plate has a through hole exposing the first bonding pad and the second bonding pad.

According to some embodiments of the present invention, the first bonding pad and the second bonding pad are respectively coupled to the connection plate via a first bonding wire and a second bonding wire passed through the through hole.

According to some embodiments of the present invention, the second die includes a third bonding pad and a fourth bonding pad adjacent to the third bonding pad, and the third bonding pad and the fourth bonding pad are respectively coupled to separate redistribution structures.

According to some embodiments of the present invention, each of the redistribution structures includes a bump contact and a conductive trace having a first end and a second end, wherein the first end is coupled to the bump contact, and the second end is coupled to one of the third bonding pad and the fourth bonding pad.

According to some embodiments of the present invention, the bump contact and the connection plate are connected to two sides of the corresponding bump.

According to some embodiments of the present invention, the first bonding pad is aligned with the fourth bonding pad, and the second bonding pad is aligned with the third bonding pad.

According to some embodiments of the present invention, the connection plate includes a supporting layer, a first electrode and a second electrode. The supporting layer has a first edge and a second edge opposite to the first edge. The first electrode and the second electrode are disposed on the supporting layer and respectively close to the first edge and the second edge.

According to some embodiments of the present invention, each of the first electrode and the second electrode is connected to the package substrate and the first die via two of the bonding wires.

According to some embodiments of the present invention, the semiconductor package further includes an encapsulating material encapsulating the first die, the second die, the interconnection member and the bonding wires.

Another aspect of the present disclosure provides a method of manufacturing a semiconductor package of any embodiment mentioned above. The method includes providing a package substrate; placing a first die on the package substrate; placing a second die over the first die; coupling the first die and the second die via an interconnection member, wherein the interconnection member comprises connection plate connected to the first die, a plurality of redistribution structures connected to the second die, and a plurality of bumps coupling the connection plate to the redistribution structures; and coupling the interconnection member to the package substrate and the first die via a plurality of bonding wires.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
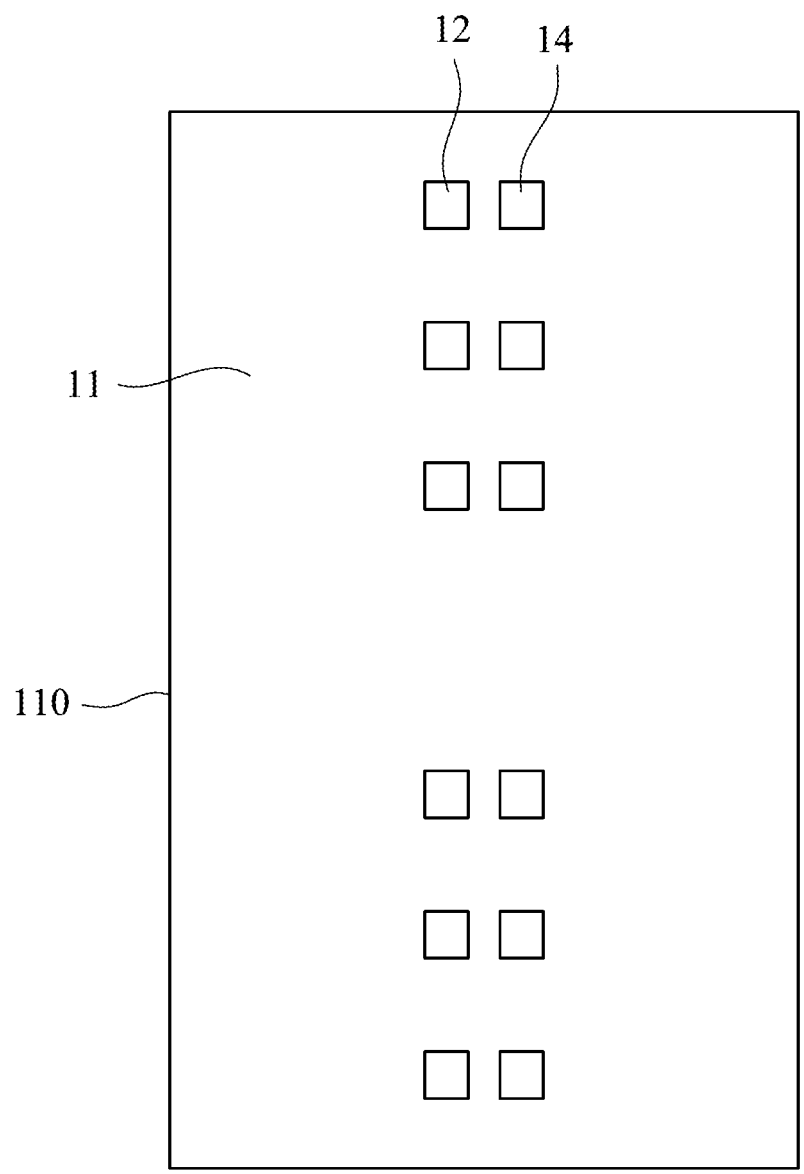
FIGS. 1-5 are schematic views of a method of manufacturing a lower portion of a semiconductor package at different stages, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A method of manufacturing a semiconductor package is described below, in accordance with some embodiments of the disclosure.

FIGS. 1-5 are schematic views of a method of manufacturing a lower portion of a semiconductor package at different stages, according to some embodiments of the present disclosure. Referring to FIG. 1, the preparation of the lower portion of the semiconductor package begins with providing a first die 10. In some embodiments, the first die 10 includes a semiconductor substrate made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In addition, the first die 10 may also include an electronic layer. The electronic layer may include a number of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, combinations thereof, and other suitable types of devices.

In some embodiments, the first die 10 includes a first bonding pad 12 and a second bonding pad 14 adjacent to the first bonding pad 12. As shown in FIG. 1, a plurality of first bonding pads 12 and second bonding pads 14 may be formed on an active surface 11 of the first die 10. In some embodiments, the first and second bonding pads 12 and 14 are respectively electrically connected to the microelectronic elements in the first die 10. The first bonding pads 12 may be aligned along a central region of the active surface 11, and the second bonding pads 14 may be parallel to the first bonding pads 12. The first and second bonding pads 12 and 14 represent any of the various terminals commonly formed near the surface of a semiconductor die through which electrical connections are made between integrated circuit in the die and external circuits.

Figure 2:
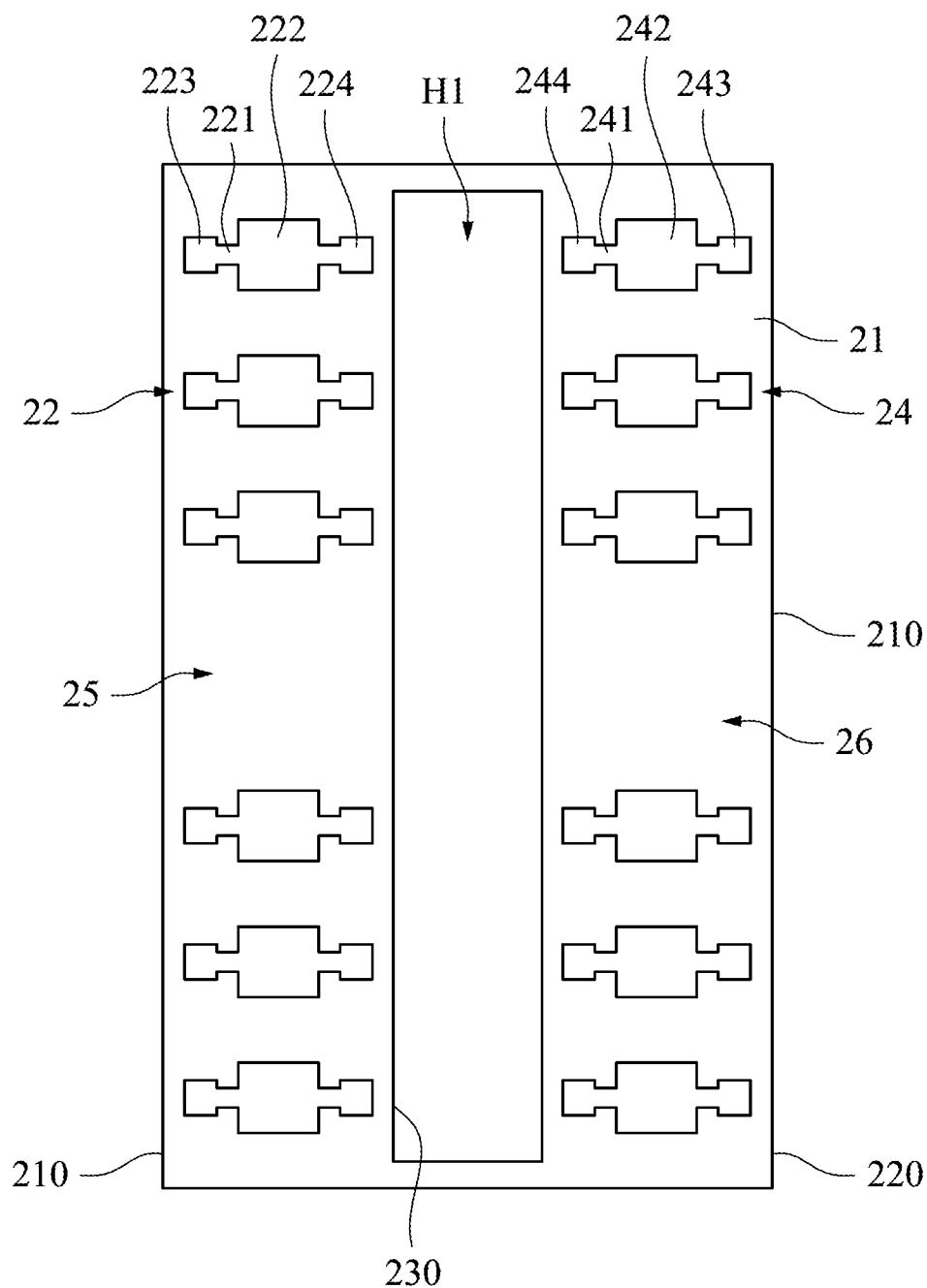

Referring to FIG. 2, the preparation of the lower portion of a semiconductor package further includes providing a connection plate 20. In some embodiments, the connection plate 20 includes a supporting layer 21, a first electrode 22 and a second electrode 24. The supporting layer 21 may be a printed-circuit board. In some embodiments, the supporting layer 21 may be made of be a ceramic, an organic, glass and/or semiconductor material or structure. As shown in FIG. 2, a through hole H1 is formed to penetrate the supporting layer 21. The through hole H1 is located at a central region of the supporting layer 21, and two operation regions 25 and 26 are located at two sides of the through hole H1. Each of the two operation regions 25 and 26 may respectively connect an inner edge 230 to outer edges (i.e., a first edge 210 and a second edge 220) of the supporting layer 21.

The first electrode 22 and the second electrode 24 are disposed on a top surface of the supporting layer 21. As shown in FIG. 2, a plurality of first electrodes 22 and second electrodes 24 are respectively close to the first edge 210 and the second edge 220. Specifically, the first electrodes 22 are arranged on the operation region 25, and the second electrodes 24 are arranged on the operation region 26. In some embodiments, each of the first electrodes 22 includes a connecting portion 221, a bump contact 222 and two wire contacts 223 and 224. Similarly, in some embodiment, each of the second electrodes 24 includes a connecting portion 241, a bump contact 242 and two wire contacts 243 and 244. The connecting portions 221 and 241 may have strip shape, and an extension direction of the connecting portions 221 and 241 may be perpendicular to the inner edge 230 and the outer edge (the first edge 210 and the second edge 220). Each of the bump contacts 222 and 242 is respectively formed on a center of the connecting portions 221 and 241. The wire contact 223 is formed on one end of the connecting portion 221 that is adjacent to the first edge 210, and the wire contact 224 is formed on the other end of the connecting portion 221 that is adjacent to the inner edge 230. Similarly, the wire contact 243 is formed on one end of the connecting portion 241 that is adjacent to the second edge 220, and the wire contact 243 is formed on the other end of the connecting portion 241 that is adjacent to the inner edge 230. The bump contacts 222, 242 and the wire contacts 223, 224, 243 and 244 may have greater width than the connecting portions 221 and 241 for facilitating electronic connection of conductive elements.

Figure 3:
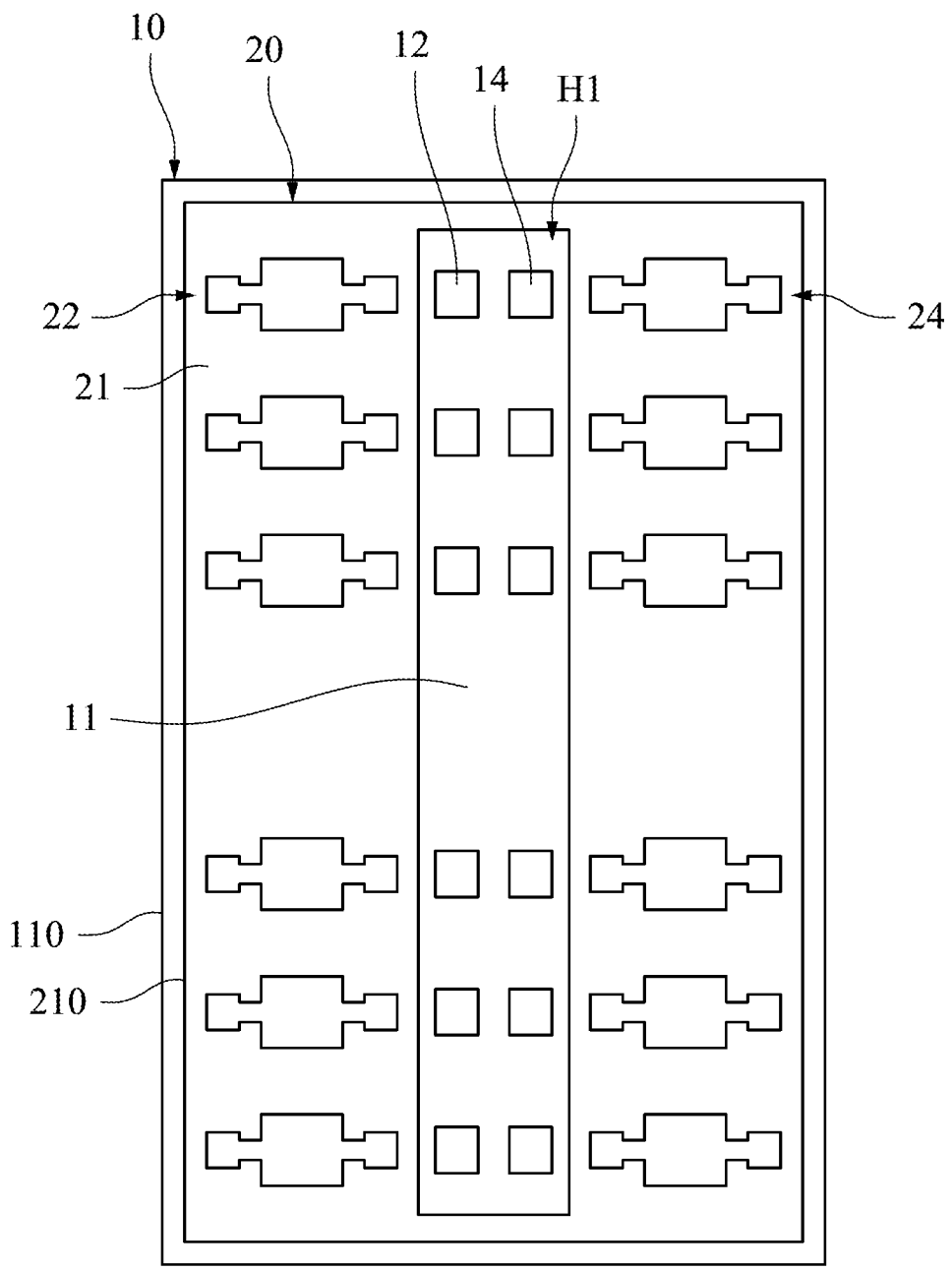

Referring to FIG. 3, the preparation of the lower portion of a semiconductor package further includes connecting the connection plate 20 to the first die 10. In some embodiments, a back surface of the supporting layer 21 that is opposite to the top surface is in direct contact with the active surface 11 of the first die 10. The supporting layer 21 may be attached to the active surface 11 of the first die 10 by an adhesive layer (not shown) using conventional processes known in the art. After the first die 10 and the connection plate 20 are assembled, the through hole H1 of the connection plate 20 exposes the first and second bonding pads 12 and 14. As shown in FIG. 3, the first bonding pad 12 may be located adjacent to the first electrode 22, and the second bonding pad 14 may be located adjacent to the second electrode 24. That is, the first bonding pad 12 and the second bonding pad 14 may be aligned with the first electrode 22 and the second electrode 24.

In some embodiments, the supporting layer 21 has a size that is substantially the same as that of the active surface 11, and the outer edge of the supporting layer 21 is overlapped with the outer edge 110 of the first die 10 after assembling the first die 10 and the connection plate 20. However, it should be appreciated that many variations and modifications can be made to embodiments of the disclosure. In cases where the supporting layer 21 has a smaller size than that of the active surface 11, the outer edge of the supporting layer 21 may be distant from the outer edge 110 of the active surface 11 after the first die 10 and the connection plate 20 are assembled.

Figure 4:
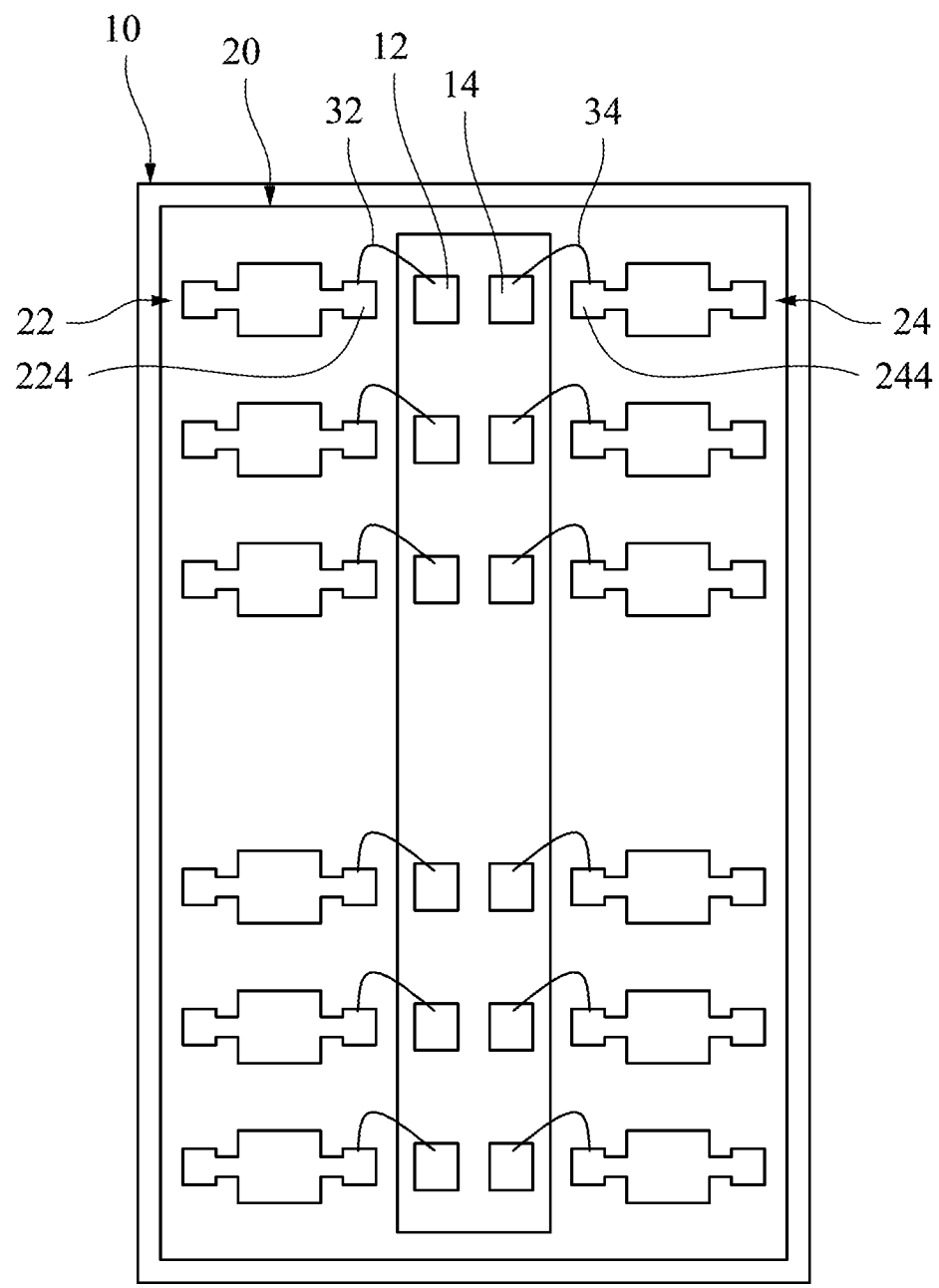

Referring to FIG. 4, the preparation of the lower portion of a semiconductor package further includes coupling the connection plate 20 to the first die 10. The first bonding pad 12 and the second bonding pad 14 of the first die 10 are respectively coupled to the connection plate 20 via a first bonding wire 32 and a second bonding wire 34 passed through the through hole H1. Specifically, the first bonding wire 32 is formed from the first bonding pad 12 to a neighboring wire contact 224, and the second bonding wire 34 is formed from the second bonding pad 14 to a neighboring wire contact 244.

Figure 5:
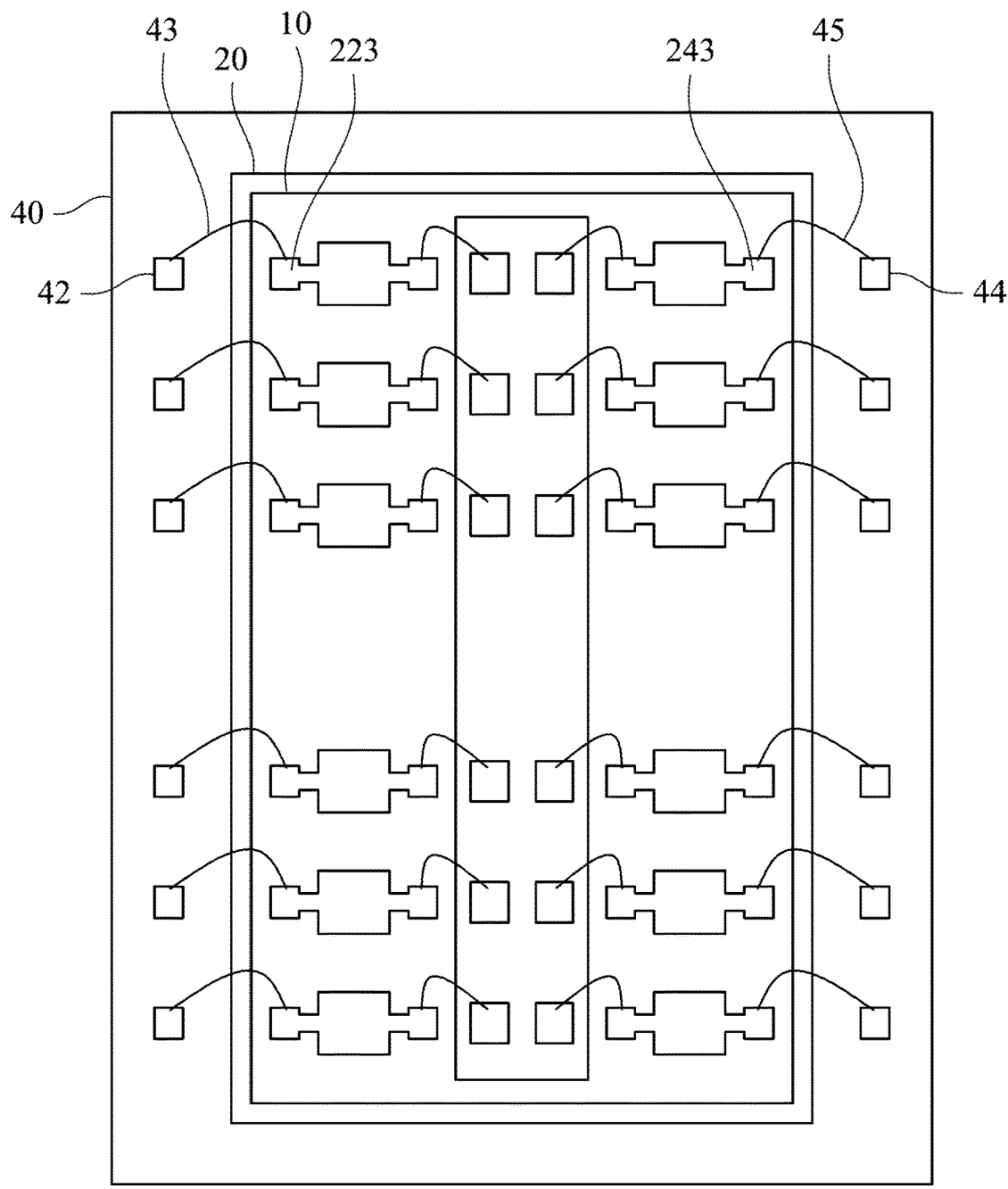

Referring to FIG. 5, the preparation of the lower portion of a semiconductor package further includes placing the first die 10 along with the connection plate 20 to a package substrate 40. In some embodiments, the package substrate 40 may be a printed-circuit board, a ceramic, an organic, glass, and/or semiconductor material or structure, which provides a backplane with power, ground, control, monitoring, etc.

In some embodiments, the package substrate 40 includes electrical routing features such as pads 42, 44 or trace layers (not shown) to route electrical signals to or from the first die 10. Specifically, a plurality of bonding wires 43 and 45 are respectively formed from the pads 42 and 44 to the neighboring wire contacts 223 and 243 to connect the first die 10 to the package substrate 40. As such, the lower portion 1L of a semiconductor package is formed. The package substrate 40 may further includes a number of solder balls 46 (illustrated in FIG. 9) formed on a bottom surface of the package substrate 40 for routing signals to route electrical signals to other electrical devices (e.g., motherboard or other chipset).

Figure 6:
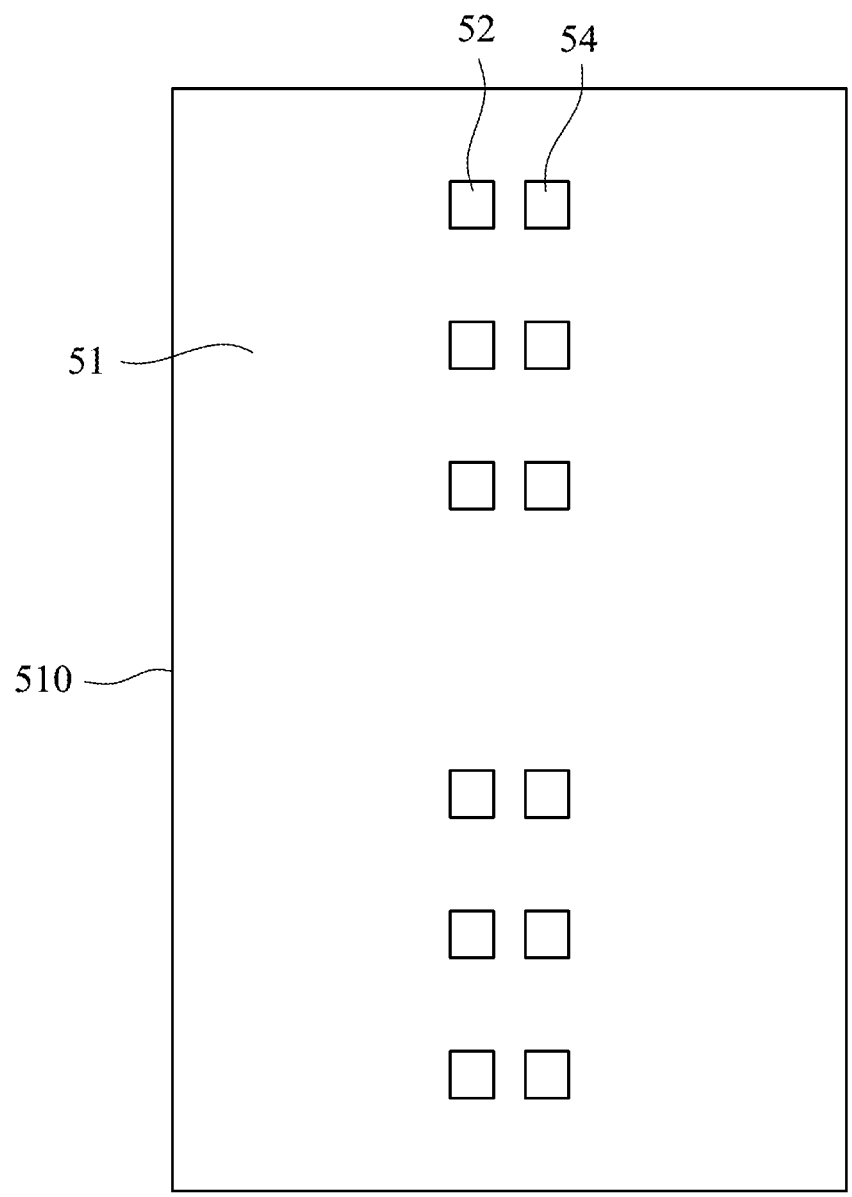
FIGS. 6-8 are schematic views of a method for manufacturing an upper portion of a semiconductor package at different stages, according to some embodiments of the present disclosure.
Figure 7:
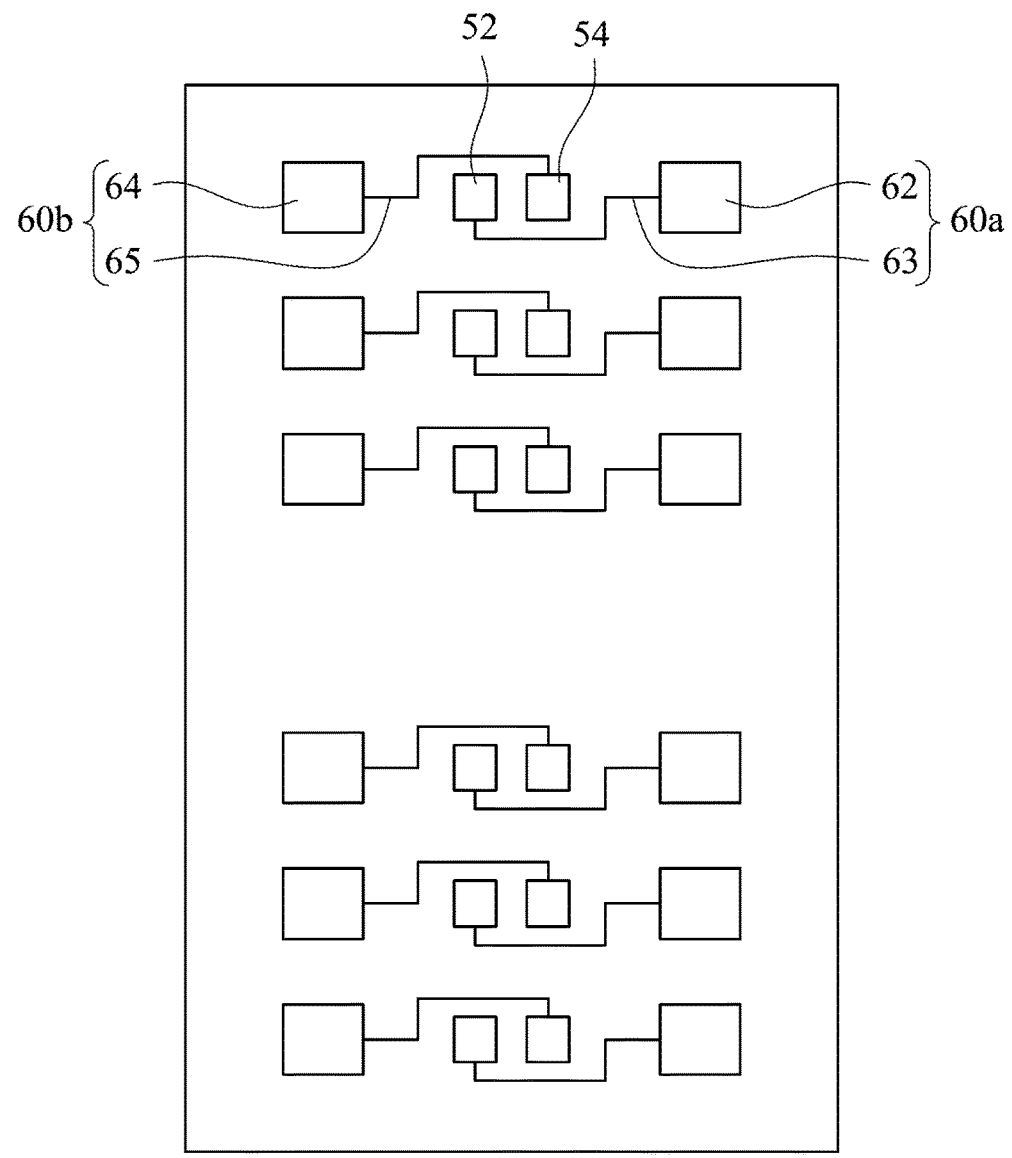
Figure 8:
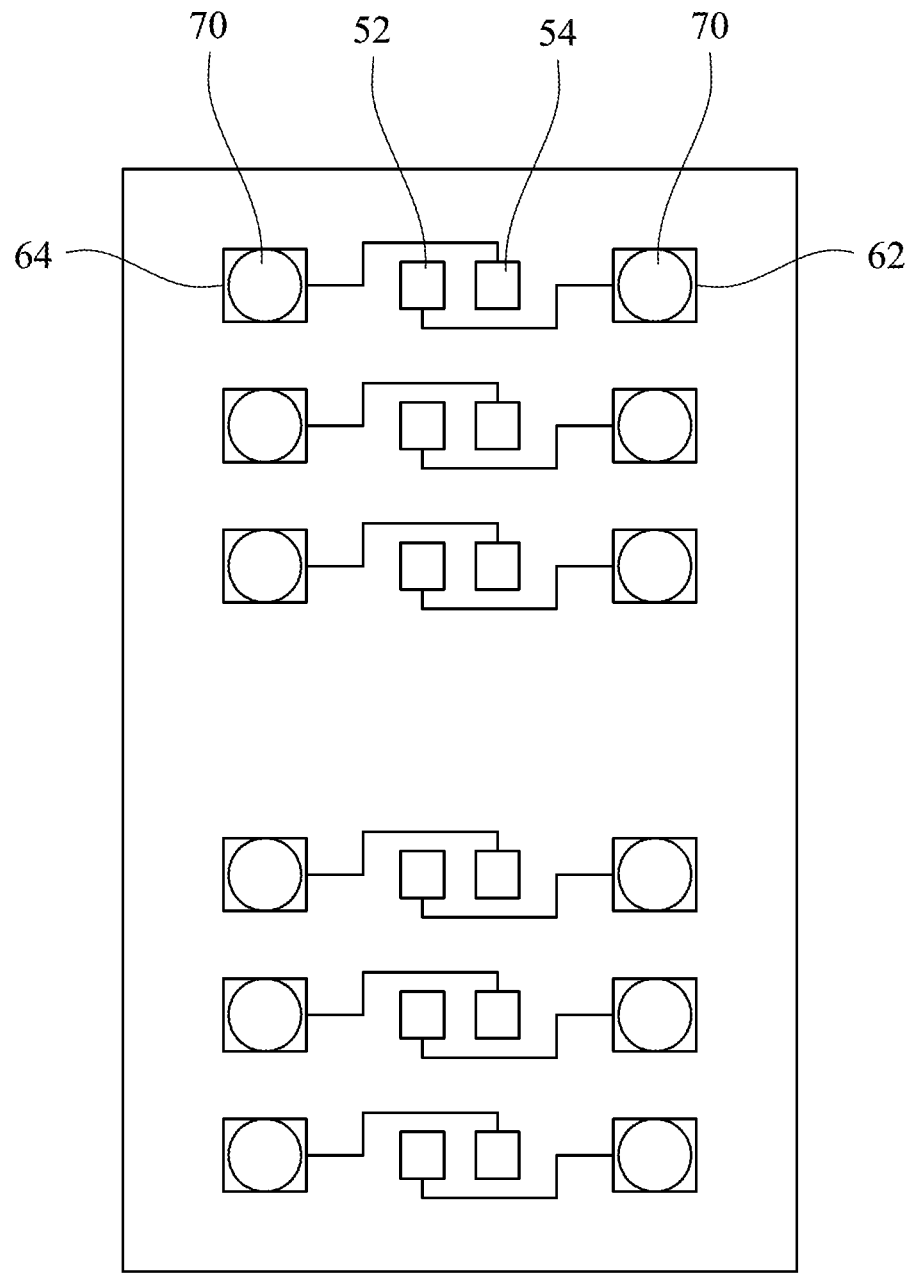

FIGS. 6-8 are schematic views of a method for manufacturing an upper portion of a semiconductor package at different stages, according to some embodiments of the present disclosure.

Referring to FIG. 6, the preparation of the upper portion of the semiconductor package begins with providing a second die 50. The second die 50 may include a semiconductor substrate made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In addition, the second die 50 may also include an electronic layer. The electronic layer may include a number of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, combinations thereof, and other suitable types of devices.

In some embodiments, the second die 50 includes a third bonding pad 52 and a fourth bonding pad 54 adjacent to the third bonding pad 52. As shown in FIG. 6, a plurality of third bonding pads 52 and fourth bonding pads 54 may be formed on an active surface 51 of the second die 50. In some embodiments, the third and fourth bonding pads 52 and 54 are respectively electrically connected to the microelectronic elements in the second die 50. The third bonding pads 52 may be aligned along a central region of the active surface 51, and the fourth bonding pads 54 may be parallel to the third bonding pads 52. The third and fourth bonding pads 52 and 54 represent any of the various terminals commonly formed near the surface of a semiconductor die through which electrical connections are made between integrated circuit in the die and external circuits.

Referring to FIG. 7, the preparation of the upper portion of a semiconductor package further includes connecting a plurality of redistribution structures 60 to the second die 50. In some embodiments, the redistribution structures 60 include a first redistribution structure 60a connected to the third bonding pad 52, and a second redistribution structure 60b connected to the fourth bonding pad 54. That is, the third bonding pad 52 and the fourth bonding pad 54 are respectively coupled to separate redistribution structures.

As shown in FIG. 7, each of the redistribution structures 60 may include a bump contact and a conductive trace. A first end of the conductive trace is coupled to the bump contact, and a second end of the conductive trace is coupled to one of the third bonding pad 52 and the fourth bonding pad 54. Specifically, the bump contact 62 neighboring the fourth bonding pad 54 is coupled to the third bonding pad 52 via the conductive trace 63, and the bump contact 64 neighboring the third bonding pad 52 is coupled to the fourth bonding pad 54 via the conductive trace 65.

Referring to FIG. 8, the preparation of the upper portion of a semiconductor package further includes dispensing a plurality of bumps 70 on the bump contacts 62 and 64 of the redistribution structures 60. In some embodiments, the bumps 70 include solder balls. As such, the upper portion 1U of a semiconductor package is formed.

Figure 9:
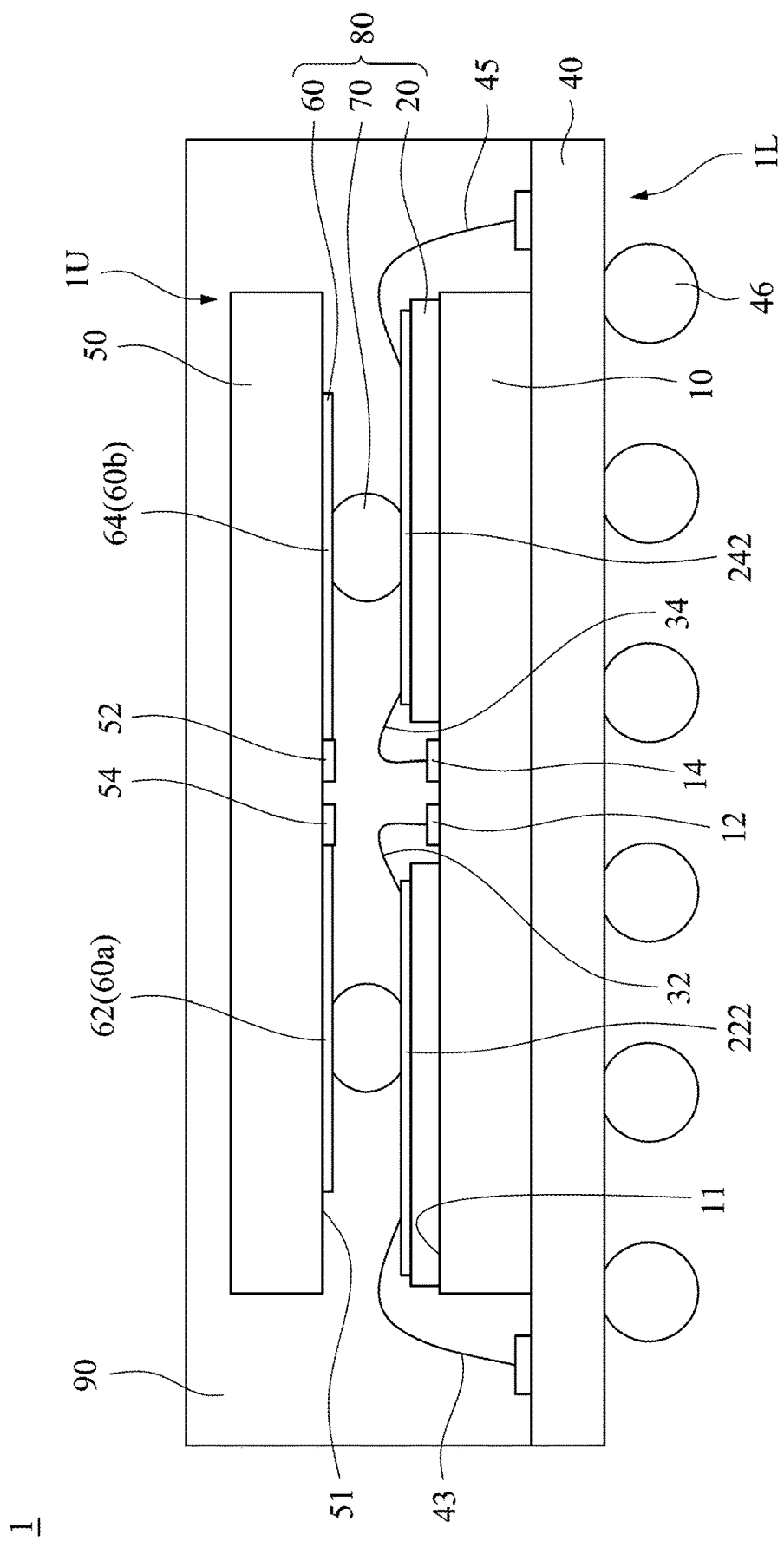
FIG. 9 is a cross-sectional view a semiconductor package, according to some embodiments of the present disclosure.

Referring to FIG. 9, after the completion of the lower portion 1L and the upper portion 1U, the method manufacturing the semiconductor package 1 further includes assembling the lower portion 1L and upper portion 1U by turning the upper portion 1U shown in FIG. 8 upside down to make the bumps 70 be located between the corresponding pair of bump contacts. For example, one bump 70 between the bump contacts 62 and 222 couples the connection plate 20 to the redistribution structures 60, as illustrated in FIG. 9. In this disclosure, since the connection plate 20, the redistribution structures 60 and the bumps 70 are configured for routing signal between the first die 10 and the second die 50, the connection plate 20, the redistribution structures 60 and the bumps 70 are also referred to as "interconnection member 80".

As shown in FIG. 9, when the upper portion 1U is stacked on the lower portion 1L, the active surface 11 of the first die 10 faces upwardly, and the active surface 51 of the second die 50 faces downwardly. In some embodiments, the first bonding pad 12 and the second bonding pad 14 of the first die 10 are respectively aligned with the fourth bonding pad 54 and the third bonding pad 52 of the second die 50. The interconnection member 80 is positioned between the active surface 11 and the active surface 51. The bump contact 62 of the first redistribution structure 60a and the bump contact 222 of the connection plate 20 are connected to two sides of the same bump 70, and the bump contacts 64 and 242 are connected to two sides of the other bump 70.

It should be appreciated that while bonding wires 32, 34, 43 and 45 are used to connect the first die 10 to the connection plate 20, and connect the package substrate 40 to the first die 10, the disclosure is not limited thereto. In some embodiments, vias (not shown) are formed in the first die 10, and the bonding wires 43 and 45 are omitted. The first die 10 is connected to the package substrate 40 via interconnects, such as bumps, that formed on the back surface of the first die 10.

The method of manufacturing the semiconductor package 1 further includes encapsulating the first die 10, the second die 50, the interconnection member 80 and the bonding wires 32, 34, 43 and 45 by an encapsulating material 90. The encapsulating material 90 may include thermosetting epoxy resin. As such, a semiconductor package 1 is formed.

As described above, a novel face to face dual die package (F2F DDP) and a method of manufacturing thereof are provided. The package of the present disclosure is suitable for coupling the semiconductor dies having two rows of bonding pads thereon, which is different from the semiconductor die with only single row of bonding pads of the conventional techniques. The redistribution structures disposed on one semiconductor die enable the bonding pads of the semiconductor die to couple with the bonding pads of another semiconductor die in a simpler method. Therefore, a manufacturing cost of the semiconductor package is reduced and the product design complexity is lowered.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor package, comprising:
a package substrate;
a first die disposed on the package substrate;
a second die disposed over the first die;
an interconnection member comprising:
 a connection plate comprising a plurality of electrodes, wherein the plurality of electrodes are disposed on a first surface of the connection plate, and the first die physically contacts a second surface of the connection plate;
 a plurality of redistribution structures connected to the second die; and
 a plurality of bumps respectively coupling the plurality of electrodes to the redistribution structures;
a plurality of first bonding wires coupling the plurality of electrodes to the package substrate; and
a plurality of second bonding wires coupling the plurality of electrodes to the first die.

2. The semiconductor package of claim 1, wherein the first die comprises a first bonding pad and a second bonding pad adjacent to the first bonding pad, and the connection plate has a through hole exposing the first bonding pad and the second bonding pad.

3. The semiconductor package of claim 2, wherein the first bonding pad and the second bonding pad are respectively coupled to the connection plate via the plurality of second bonding wires passed through the through hole.

4. The semiconductor package of claim 2, wherein the second die comprises a third bonding pad and a fourth bonding pad adjacent to the third bonding pad, and the third bonding pad and the fourth bonding pad are respectively coupled to the corresponding one of the plurality of redistribution structures.

5. The semiconductor package of claim 4, wherein each of the plurality of redistribution structures comprises a bump contact and a conductive trace having a first end and a second end, wherein the first end is coupled to the bump contact, and the second end is coupled to one of the third bonding pad and the fourth bonding pad.

6. The semiconductor package of claim 5, wherein the bump contact and the connection plate are connected to two sides of the corresponding bump.

7. The semiconductor package of claim 4, wherein the first bonding pad is aligned with the fourth bonding pad, and the second bonding pad is aligned with the third bonding pad.

8. The semiconductor package of claim 1, wherein the connection plate comprises:
a supporting layer having a first edge and a second edge opposite to the first edge, wherein the plurality of electrodes are disposed on the supporting layer.

9. The semiconductor package of claim 1, wherein each of the plurality of electrodes includes a bump contact, a plurality of wire contacts adjacent to the bump contact, a plurality of connecting portions connecting the bump contact and the plurality of wire contacts, wherein a width of each of the plurality of connecting portions is smaller than a width of the bump contact and a width of each of the plurality of wire contacts.

10. The semiconductor package of claim 1, further comprising an encapsulating material encapsulating the first die, the second die, the interconnection member, the plurality of first bonding wires and the plurality of second bonding wires.

11. A method of manufacturing a semiconductor package, comprising:
providing a package substrate;
placing a first die on the package substrate;
placing a second die over the first die;
coupling the first die and the second die via an interconnection member, wherein the interconnection member comprises:
 a connection plate comprising a plurality of electrodes, wherein the plurality of electrodes are disposed on a first surface of the connection plate, and the first die physically contacts a second surface of the connection plate;
 a plurality of redistribution structures connected to the second die; and
 a plurality of bumps respectively coupling the plurality of electrodes to the redistribution structures;
coupling the plurality of electrodes to the package substrate via a plurality of first bonding wires; and
coupling the plurality of electrodes to the first die via a plurality of second bonding wires.

12. The method of claim 11, wherein the connection plate has a through hole exposing a first bonding pad and a second bonding pad of the first die, wherein the second bonding pad is adjacent to the first bonding pad.

13. The method of claim 12, wherein coupling the interconnection member to the first die comprises coupling the connection plate to the first bonding pad and the second bonding pad respectively via the plurality of second bonding wires passed through the through hole.

14. The method of claim 12, wherein the second die comprises a third bonding pad and a fourth bonding pad adjacent to the third bonding pad, and the third bonding pad and the fourth bonding pad are respectively coupled to the corresponding one of the plurality of redistribution structures.

15. The method of claim 14, wherein each of the plurality of redistribution structures comprises a bump contact and a conductive trace having a first end and a second end, wherein the first end is coupled to the bump contact, and the second end is coupled to one of the third bonding pad and the fourth bonding pad.

16. The method of claim 15, wherein the bump contact and the connection plate are connected to two sides of the corresponding bump.

17. The method of claim 14, wherein the first bonding pad is aligned with the fourth bonding pad, and the second bonding pad is aligned with the third bonding pad.

18. The method of claim 11, wherein the connection plate comprises:
   a supporting layer having a first edge and a second edge opposite to the first edge; and
   the plurality of electrodes disposed on the supporting layer.

19. The method of claim 11, wherein each of the plurality of electrodes includes a bump contact, a plurality of wire contacts adjacent to the bump contact, a plurality of connecting portions connecting the bump contact and the plurality of wire contacts, wherein a width of each of the plurality of connecting portions is smaller than a width of the bump contact and a width of each of the plurality of wire contacts.

20. The method of claim 11, further comprising encapsulating the first die, the second die, the interconnection member, the plurality of first bonding wires and the plurality of second bonding wires by an encapsulating material.

* * * * *